US008217690B2

(12) United States Patent
Hu et al.

(10) Patent No.: US 8,217,690 B2
(45) Date of Patent: Jul. 10, 2012

(54) FREQUENCY SYNTHESIZER

(75) Inventors: Weiliang Hu, Kanagawa (JP); Noriaki Matsuno, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 66 days.

(21) Appl. No.: 12/801,042

(22) Filed: May 18, 2010

(65) Prior Publication Data

US 2010/0301910 A1 Dec. 2, 2010

(30) Foreign Application Priority Data

May 26, 2009 (JP) ................................. 2009-126056

(51) Int. Cl.
*H03L 7/099* (2006.01)
*H03L 1/00* (2006.01)
(52) U.S. Cl. .......... 327/156; 327/105; 327/147; 331/17; 331/36 C; 331/176; 331/177 V; 375/376
(58) Field of Classification Search .................. 327/105, 327/147, 156, 512, 513; 331/16, 17, 36 C, 331/66, 176, 177 V; 375/354, 362, 373, 376
See application file for complete search history.

(56) References Cited

U.S. PATENT DOCUMENTS

| 6,686,804 | B1 * | 2/2004 | Adams et al. ................... 331/17 |
| 6,744,324 | B1 * | 6/2004 | Adams et al. ................... 331/17 |
| 6,980,062 | B2 * | 12/2005 | Fujita ............................ 331/176 |
| 7,573,342 | B2 * | 8/2009 | Grewing et al. ................ 331/74 |
| 7,800,454 | B2 * | 9/2010 | Vanselow et al. ........... 331/36 C |
| 8,013,682 | B2 * | 9/2011 | Hu et al. ......................... 331/16 |
| 2007/0085620 | A1 | 4/2007 | Ohkubo et al. | |

FOREIGN PATENT DOCUMENTS

| JP | 2006-135892 A | 5/2006 |
| JP | 2007-110504 A | 4/2007 |

* cited by examiner

*Primary Examiner* — Patrick O'Neill
(74) *Attorney, Agent, or Firm* — McGinn IP Law Group, PLLC

(57) ABSTRACT

A frequency synthesizer comprises a VCO group; a phase comparator; and a loop filter. Each VCO includes a varactor and a capacitor bank including a plurality of weighted capacitance elements, and a plurality of switches turned ON and OFF based on a control signal. Also provided a temperature compensation including a varactor correction potential generation circuit, a correction potential generation circuit for parasitic capacitance of the capacitor bank, a variable gain amplifier in which weighting processing, based on a control signal of the capacitor bank, is performed on an output potential of the correction potential generation circuit, and an adder circuit that adds the output voltage of the correction potential generation circuit of the varactor and output voltage of the variable gain amplifier, and the varactor of the VCO is controlled by output (correction potential) of the adder circuit.

20 Claims, 15 Drawing Sheets

VARIABLE GAIN AMPLIFIER

CORRECTION POTENTIAL GENERATION CIRCUIT FOR
PARASITIC CAPACITANCE OF CAPACITOR BANK

CORRECTION POTENTIAL GENERATION CIRCUIT OF VARACTOR

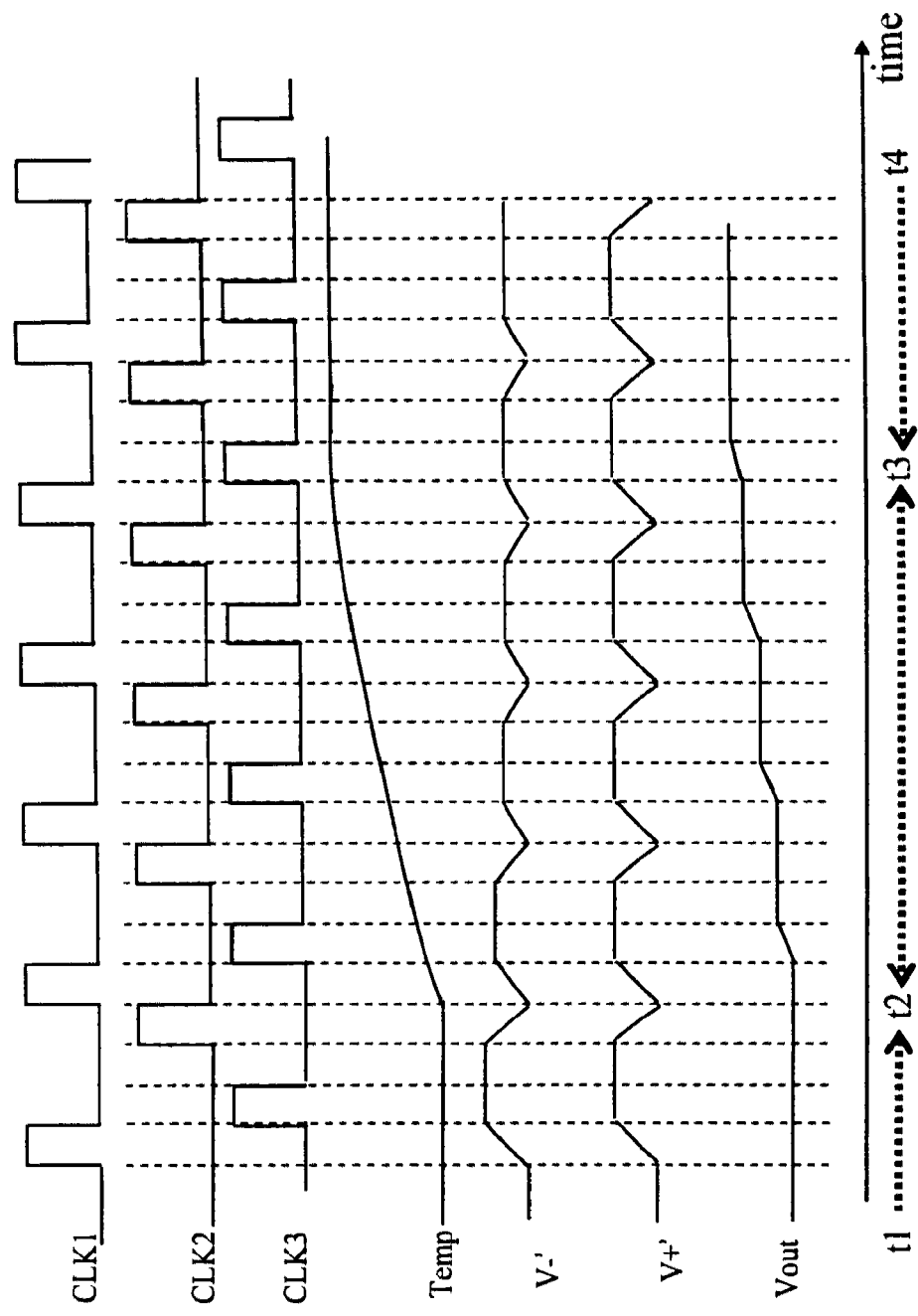

FREQUENCY SYNTHESIZER

TECHNICAL FIELD

Reference to Related Application

This application is based upon and claims the benefit of the priority of Japanese patent application No. 2009-126056, filed on May 26, 2009, the disclosure of which is incorporated herein in its entirety by reference thereto.

The present invention relates to a frequency synthesizer, and in particular to a frequency synthesizer using a PLL (Phase Locked Loop).

BACKGROUND

In wireless communication equipments, tuners, and so forth, a frequency synthesizer using a PLL (also referred to as a PLL synthesizer, or simply a PLL) is widely used. FIG. 1 is a diagram showing one example of a typical configuration of a frequency synthesizer. Referring to FIG. 1, the frequency synthesize includes a VCO (Voltage Controlled Oscillator) group 5, a frequency divider circuit (variable frequency divider circuit) 4 that frequency-divides a VCO output 24 (frequency Fvco), a phase comparator 2 that detects a phase difference between a signal (frequency Fsig) 22 obtained by frequency division by the frequency divider circuit 4 and a signal (reference frequency Fref) 21 from a reference oscillator circuit 1, a loop filter (low pass filter LPF) 3 that smoothes an output signal from the phase comparator 2 and outputs a control voltage to the VCO group 5, and a VCO automatic control block 6 that selects one VCO from among the VCO group 5 and performs selection of a capacitor bank in the VCO concerned.

Each VCO of the VCO group 5 comprises a capacitor bank including a plurality of capacitance elements 56 to 58 for coarse frequency adjustment, an inductor 51, a varactor (varactor diode: variable capacitance element) 52 for fine adjustment of frequency, and a negative resistance unit 50. The negative resistance unit 50 compensates loss in an LC resonant circuit to enable the VCO to oscillate.

An output voltage 23 (Vtune: varactor control voltage) of a loop filter 3 is applied to a varactor 52 of the VCO group 5.

Selection of the capacitor bank in the VCO group 5 is performed by ON-OFF control of switches between the capacitor elements 56 to 58 and GND (ground) by a capacitor bank switching signal bit=0 to bit=N, from the VCO automatic control block 6.

With reference to FIG. 2, operation of this frequency synthesizer is described. FIG. 2 shows an external data signal, operations (VCO selection and capacitor bank selection) of the VCO automatic control block 6 of FIG. 1, and a PLL loop voltage (23 in FIG. 1).

In a case where a channel is changed, with the frequency synthesizer in a locked state, transfer of data such as channel setting information and the like is performed (data transfer period 1 in FIG. 2).

Next, the coarse frequency adjustment is performed, and the selection of the VCO, and the selection of the capacitor bank is performed (coarse frequency adjustment period 2).

Next, phase pull-in (loop pull-in) operation, changing the varactor control voltage (Vtune) 23 for fine frequency adjustment, is performed (fine frequency period 3 in FIG. 2).

Above, the time required for a series of frequency tuning, as shown in FIG. 2, is the total amount necessary for the channel setting data transfer, and the coarse frequency adjustment and the fine frequency adjustment (for example, from 1 ms (millisecond) to 3 ms).

However, together with temperature variation, the lock on the frequency synthesizer may be released. A detailed description will be given below concerning this.

As a capacitor bank switch, in general a MOSFET (Metal-Oxide-Semiconductor Field Effect transistor) is used. Even when the switch is in an OFF state, since MOSFET parasitic capacitance is present, an oscillation frequency changes in accordance with the change in temperature, due to the fact that the VCO varactor 52 and the parasitic capacitance of the capacitor bank switch each possess a temperature characteristic. Accordingly, the VCO varactor control voltage (Vtune) 23 changes so as to maintain a state in which the frequency is locked.

If this control voltage 23 exceeds a variable frequency range, the locked state can no longer be maintained. Thus, in the PLL, readjustment of the coarse frequency adjustment and fine frequency adjustment of the VCO is performed. That is, there is a possibility of data reception being frequently cut off due to the lock being released together with temperature variation. In order to solve this problem, it is desirable to suppress temperature dependency of the parasitic capacitance of the varactor and the capacitor bank due to the frequency temperature variation of a VCO main unit.

A circuit supplying a correction voltage equivalent to a temperature variation amount by a temperature compensation circuit is described in Patent Document 1 (JP Patent Kokai Publication No. JP-P2007-110504A) and Patent Document 2 (JP Patent Kokai Publication No. JP-P2006-135892A).

FIG. 3 is a diagram (FIG. 2 in Patent Document 1) showing a configuration of Patent Document 1 (JP Patent Kokai Publication No. JP-P2007-110504A). As shown in FIG. 3, a variable capacitance circuit 12a whose voltage can be controlled, an inductor circuit 11, a negative resistance circuit 13a, and a temperature variation monitor control circuit 20 that outputs a correction potential, are provided. The temperature variation monitor control circuit 20 adds a weighted potential equivalent to the temperature variation amount for a control potential, to be supplied to one end of variable capacitance elements V5 and V6.

FIG. 4 is a diagram (FIG. 1 in Patent Document 2) showing a configuration of Patent Document 2 (JP Patent Kokai Publication No. JP-P2006-135892A). A resonant circuit is provided with a negative resistor 19b, an inductor 19a, a first capacitor 18 in which capacitance changes according to a first voltage 17 given from outside, and a plurality of capacitors 11a, 11b, 11c, and 11d in which capacitance changes by a correction control voltage. The correction control voltage is generated by a logic synthesis (full adder 12) based on frequency information 13 and an automatic correction value 14. The automated correction value is corrected based on the frequency information, which is indicated from outside.

[Patent Document 1]
  JP Patent Kokai Publication No. JP-P2007-110504A (FIG. 2)

[Patent Document 2]
  JP Patent Kokai Publication No. JP-P2006-135892A (FIG. 1)

SUMMARY

The entire disclosure of Patent Documents 1 and 2 is incorporated herein by reference thereto.

The following analysis is given of related technology according to the present invention.

In a case where a configuration of Patent Document 1 (JP Patent Kokai Publication No. JP-P2007-110504A) is applied to a frequency synthesizer using a capacitor bank, a constant temperature compensation voltage is used, unrelated to a state of the capacitor bank. When a control state of the capacitor bank is changed, the temperature compensation is incomplete only by an amount of the temperature characteristic of parasitic capacitance of the capacitor bank.

In Patent Document 2 (JP Patent Kokai Publication No. JP-P2006-135892A), a correction voltage generation means collects frequency information from outside and generates a control voltage for a variable capacitor used in the frequency compensation, by logic synthesis. In this case, a setting state of the capacitor bank is estimated from the frequency information. However, since the capacitor bank setting differs even for the same frequency due to variances, a correction error easily occurs. Since correspondence between the frequency information and the correction voltage is held in a table, a circuit such as a ROM (read only memory) or the like is necessary, and circuit size becomes large.

Therefore, it is an object of the present invention to provide a frequency synthesizer that enhances a variation withstand capability, and that when there is a temperature variation, compensates for VCO frequency variation.

According to the present invention there is provided a frequency synthesizer that includes: a voltage controlled oscillator circuit; a phase comparator that performs phase comparison of output of the voltage controlled oscillator circuit or a signal obtained by performing frequency division of the output thereof and a reference signal; and a loop filter that generates a control voltage to the voltage controlled oscillator circuit based on a result of the phase comparison. The voltage controlled oscillator circuit includes a capacitor bank and a variable capacitance element. The capacitor bank includes a plurality of weighted capacitance elements and a plurality of switches turned ON and OFF based on a plurality of bit signals corresponding respectively to the plurality of capacitance elements. Also is provided a temperature compensation block that includes a first correction potential generation circuit that generates a correction potential for parasitic capacitance of the capacitor bank of the voltage controlled oscillator circuit, a second correction potential generation circuit that generates a correction potential for the variable capacitance element, a weighting circuit that performs weighting processing, based on the bit signals which are for control, on an output potential of the second correction potential generation circuit, and a combining circuit that combines an output voltage of the first correction potential generation circuit and an output voltage of the weighting circuit. The variable capacitance element of the voltage controlled oscillator circuit is controlled by output of the combining circuit of the temperature compensation block.

According to the present invention, it is possible to provide a frequency synthesizer that strengthens variation tolerance, and when there is a temperature variation, compensates for VCO frequency variation.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 is a timing diagram for describing operation of the correction potential generation circuit for parasitic capacitance of the capacitor bank.

PREFERRED MODES

In the present invention, since control data for a capacitor bank is used, tolerance of variation is made strong. By correcting parasitic capacitance of a varactor and the capacitor bank due to frequency temperature dependency of a VCO, the frequency variation of the VCO is completely compensated for, when there is a temperature variation.

Figure 5:
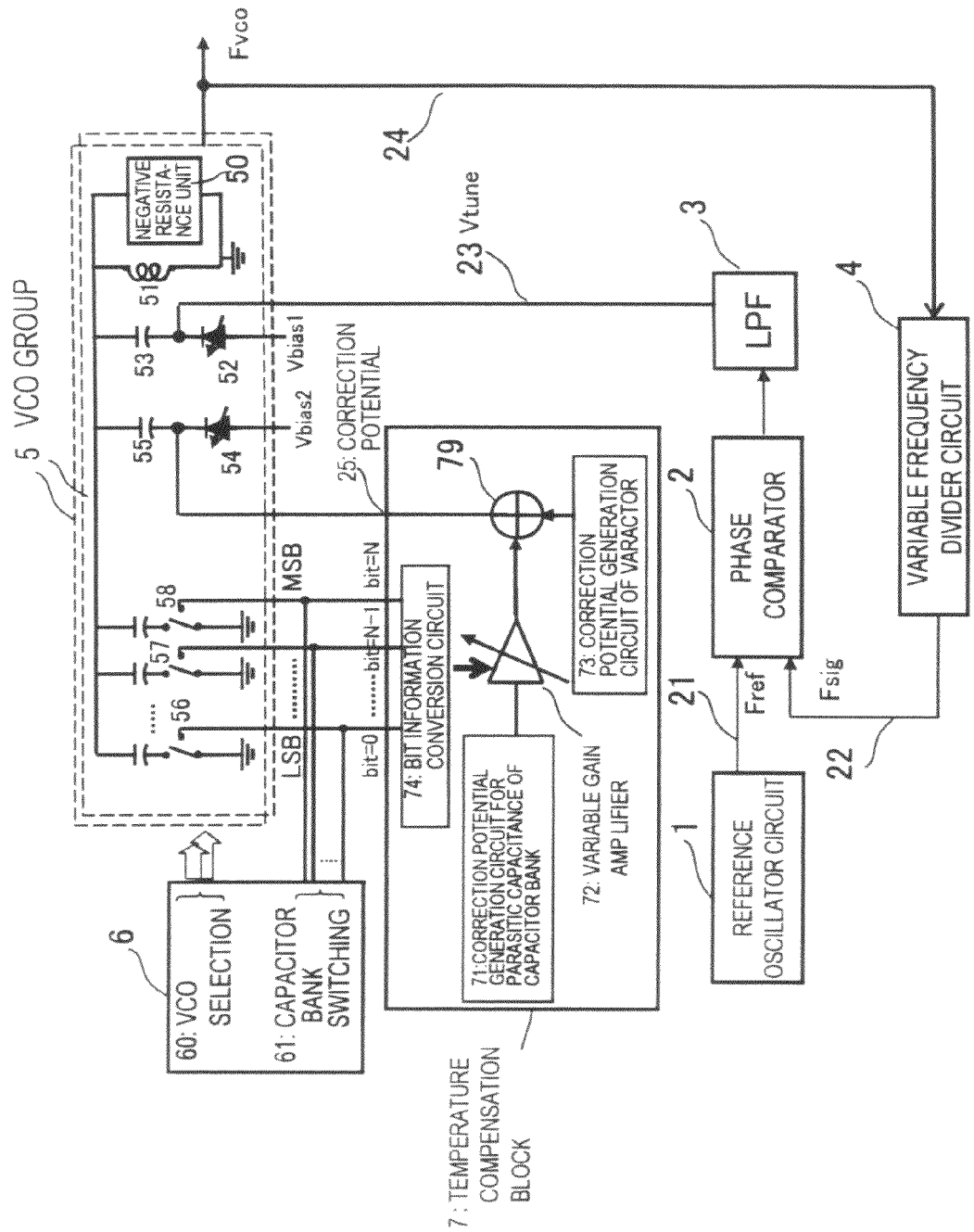
FIG. 5 is a diagram showing a configuration of a first exemplary embodiment of the present invention.

In one embodiment of the present invention, as shown in FIG. 5, in addition to a correction potential generation circuit (temperature compensation circuit) 73 of the varactor, which generates a varactor correction potential, a correction potential generation circuit (temperature compensation circuit) 71 for the parasitic capacitance of the capacitor bank, which generates a correction potential for the parasitic capacitance of the capacitor bank, is provided.

In the present embodiment, the compensation potential that compensates for the temperature characteristic of the VCO is generated independently of the correction potential of the temperature characteristic due to the varactor, and a component that corrects a temperature characteristic due to the capacitor bank. By changing a weighting amount of the component that corrects the temperature characteristic due to the capacitor bank, in accordance with bit control data (bit=0 to bit=N) for performing switching of the capacitor bank, it is possible to correct the temperature characteristic of the VCO irrespective of an ON rate in the capacitor bank. A description is given below according to a specific exemplary embodiment.

FIG. 5 is a diagram showing a configuration of a first exemplary embodiment of a frequency synthesizer according to the present invention. Referring to FIG. 5, this frequency synthesizer includes a reference oscillator circuit 1, a phase comparator 2, an LPF 3, a frequency divider circuit (variable frequency divider circuit) 4, a VCO group 5, a VCO automatic control block 6 that controls a VCO oscillation frequency band and VCO capacitor bank, and a temperature compensation block 7.

Each VCO of the VCO group 5 is provided with a negative resistance unit 50, an inductor 51, a varactor 52 for analog fine frequency adjustment, a capacitor 53, a capacitor bank including a plurality of capacitor elements 56 to 58 that are digitally controlled, a compensation varactor 54, and a compensation capacitor 55.

Figure 6:
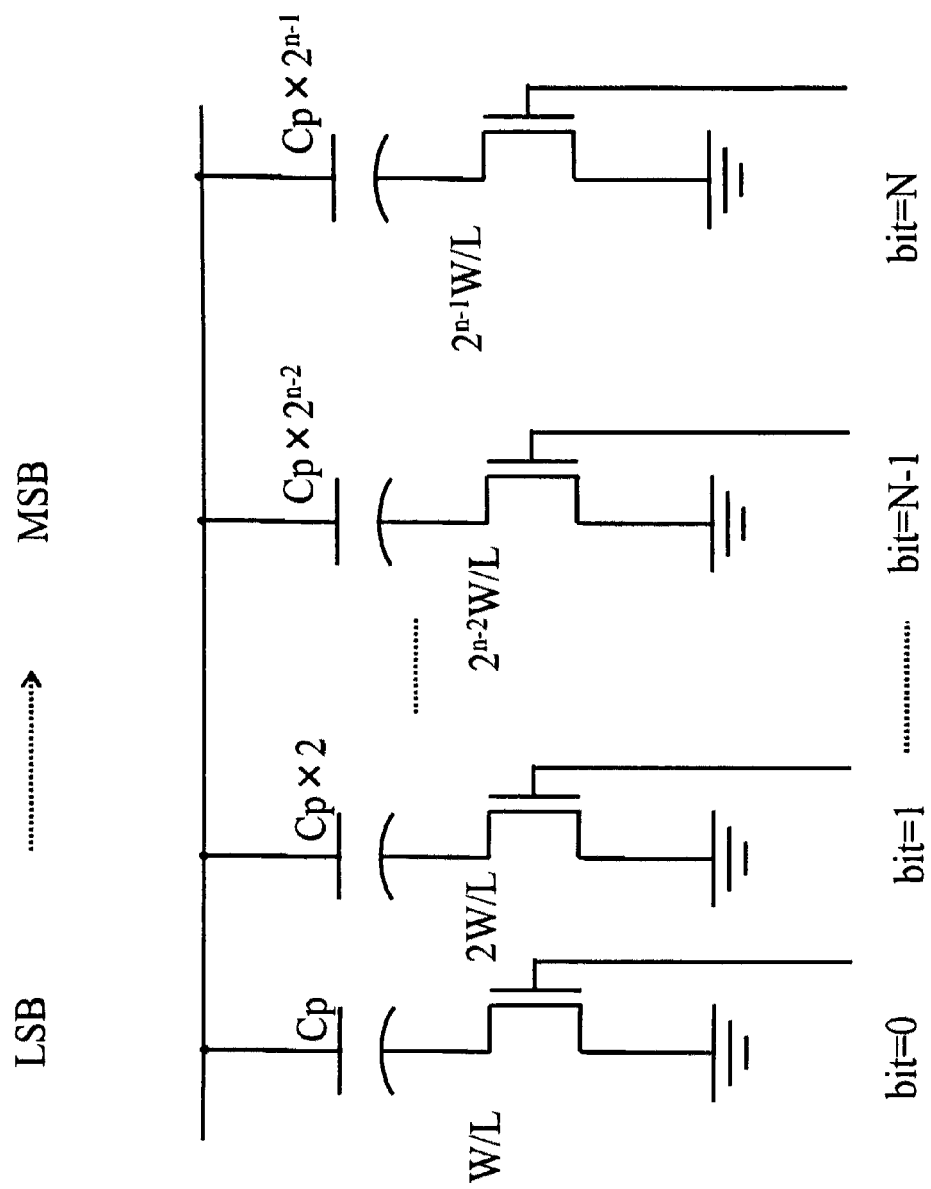
FIG. 6 is a diagram showing a configuration of a capacitor bank of FIG. 5.

In the VCO group 5, the capacitor elements (weighted capacitor elements) 56 to 58 relates to switch capacitance cells weighted to powers of 2, on an LSB to MSB (N bits) side, as shown in FIG. 6. Capacitance values of the capacitor elements 56 to 58 are C, C$\times$2, ... and C$p\times2^{(n-1)}$. W/L ratios of a MOS transistor forming a control switch are W/L, 2(W/L), ... $2^{(n-1)}$(W/L).

When a bit signal connected with a gate of the MOS transistor forming the control switch (there is no particular limitation, but this may be an N-channel MOS transistor connected between a capacitor and GND) is High, in an ON state, one end of a capacitor is grounded, the capacitor is connected in parallel with the varactor, and capacitance value can be seen as being added.

On the other hand, when a bit signal connected with a gate of the MOS transistor forming the control switch (there is no particular limitation, but this may be an N-channel MOS transistor connected between a capacitor and GND is Low, in an OFF state, a capacitor connected with the control switch is nearly open. However, since MOS parasitic capacitance is attached to the capacitor bank when OFF, a series capacitance of the MOS parasitic capacitance and the capacitor bank can be seen.

The temperature compensation block 7 is provided with a bit information conversion circuit 74, that changes bit information of the VCO capacitor elements 56 to 58, a variable gain amplifier 72 in which gain can be varied according to control information from the bit information conversion circuit 74, a correction potential generation circuit 71 for the parasitic capacitance of the capacitor bank, and a correction potential generation circuit 73 of the varactor.

A correction potential 25 obtained by combining, in an adder circuit 79, a potential (correction potential for the parasitic capacitance of the capacitor bank) outputted from the correction potential generation circuit 71 for the parasitic capacitance of the capacitor bank and amplified by the variable gain amplifier 72, and a correction potential (correction potential of the varactor) from the correction potential generation circuit 73 of the varactor, is given to the VCO compensation varactor 54.

Figure 7A:
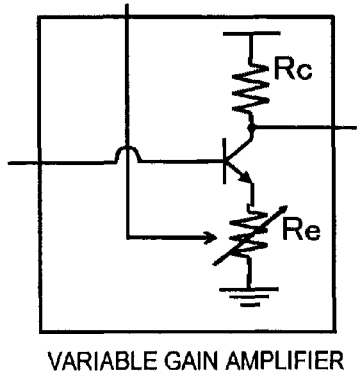
FIG. 7A is a diagram showing a configuration of a variable gain amplifier.

FIG. 7A is a diagram showing a configuration example of the variable gain amplifier 72 of the temperature compensation block 7. If an emitter resistance (variable resistance) of an NPN bipolar transistor is Re and a collector resistance is Rc, then $$\text{Gain} \approx Rc/Re \qquad (1)$$

By a resistance value of the emitter resistance (variable resistance) Re changing according to a bit control state of the VCO capacitor bank, it is possible to adjust the gain.

The bit information conversion circuit 74 of FIG. 5 is provided with a D/A converter (not illustrated in the diagrams) that receives as input N+1 bits and outputs an analog voltage, and, by an output voltage of the D/A converter (not illustrated in the diagrams), makes a setting such that the emitter resistance Re of FIG. 7A has a resistance value given by Expression (2) below.

$$R_e = \frac{1}{G_0 + A_n \times S_n + A_{n-1} \times S_{n-1} + \ldots + A_1 \times S_1 + A_0 \times S_0} \qquad (2)$$

Here, An, An−1, A1, A0 are weighted constants of respective bit positions of the capacitor elements in the capacitor bank and Sn, Sn−1, ... S1, S0 are respectively given values of "0" when the switch is ON and "1" when the switch is OFF, for respective bit positions of the capacitor elements.

Figure 7B:
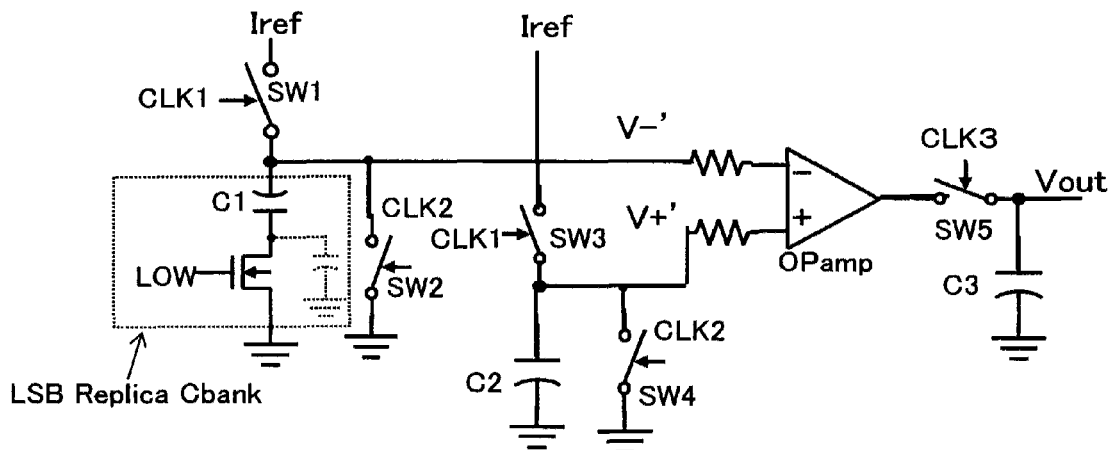
FIG. 7B shows a configuration of a correction potential generation circuit for parasitic capacitance of the capacitor bank.

FIG. 7B is a diagram showing a configuration of the correction potential generation circuit 71 for parasitic capacitance of the capacitor bank of FIG. 5. Referring to FIG. 7B, the correction potential generation circuit 71 for parasitic capacitance of the capacitor bank is provided with a replica circuit (LSB Replica Cbank) in the capacitor bank 56 with a LSB (Least Significant Bit) in the capacitor bank within the VCO group 5. In the replica circuit (LSB Replica Cbank), a capacitor C1 is connected in series to an N-channel MOS transistor with a gate at a Low potential and in an OFF state, and is connected to a constant current Iref from a constant current source (not illustrated in the diagrams) via a switch SW1 that is turned ON and OFF by a clock signal CLK1.

The capacitor C1 of this replica circuit (LSB Replica Cbank) is charged for a fixed time by the constant current (reference current) Iref (the switch SW1 is turned ON by the clock signal CLK1); another fixed capacitor C2 is charged for the same time by the constant current (reference current) Iref (a switch SW3 is turned ON by the clock signal CLK1); and by detecting a potential difference of the two by a differential amplifier circuit (OPamp), the capacitance value change is monitored according to temperature of the replica circuit. An output voltage of the differential amplifier circuit (OPamp) is sampled in a capacitor C3 via a switch SW5 turned ON and OFF by CLK3, and a terminal voltage of the capacitor C3 is Vout. Switches SW2 and SW4 are ON-OFF controlled by a clock CLK2, and are reset switches that discharge the charges of the capacitors C1 and C2. When CLK1 is High, the capacitors C1 and C2 are charged by the constant current Iref, and when CLK1 becomes Low the charging of the capacitors C1 and C2 is stopped, CLK3 becomes High and a switch SW5 is ON, output from the differential amplifier circuit (OPamp) is outputted to Vout, CLK3 becomes Low, Vout is maintained to the capacitor C5, and thereafter, CLK2 becomes High, SW2 and SW4 are ON, and the capacitors C1 and C2 are discharged.

Figure 7C:
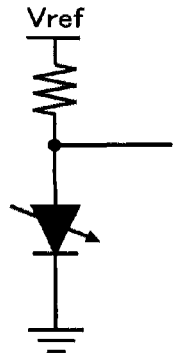
FIG. 7C shows a configuration of a correction potential generation circuit of a varactor.

FIG. 7C is a diagram showing one configuration of the correction potential generation circuit 73 of the varactor. A temperature characteristic of a diode Vf (threshold) is used to obtain an output potential that depends on temperature.

Next, operation of the frequency synthesizer (PLL) of FIG. 5 is described.

A correction potential (initial correction direct current bias) 25 is given to the compensation varactor 54 of the VCO group 5.

Figure 1:
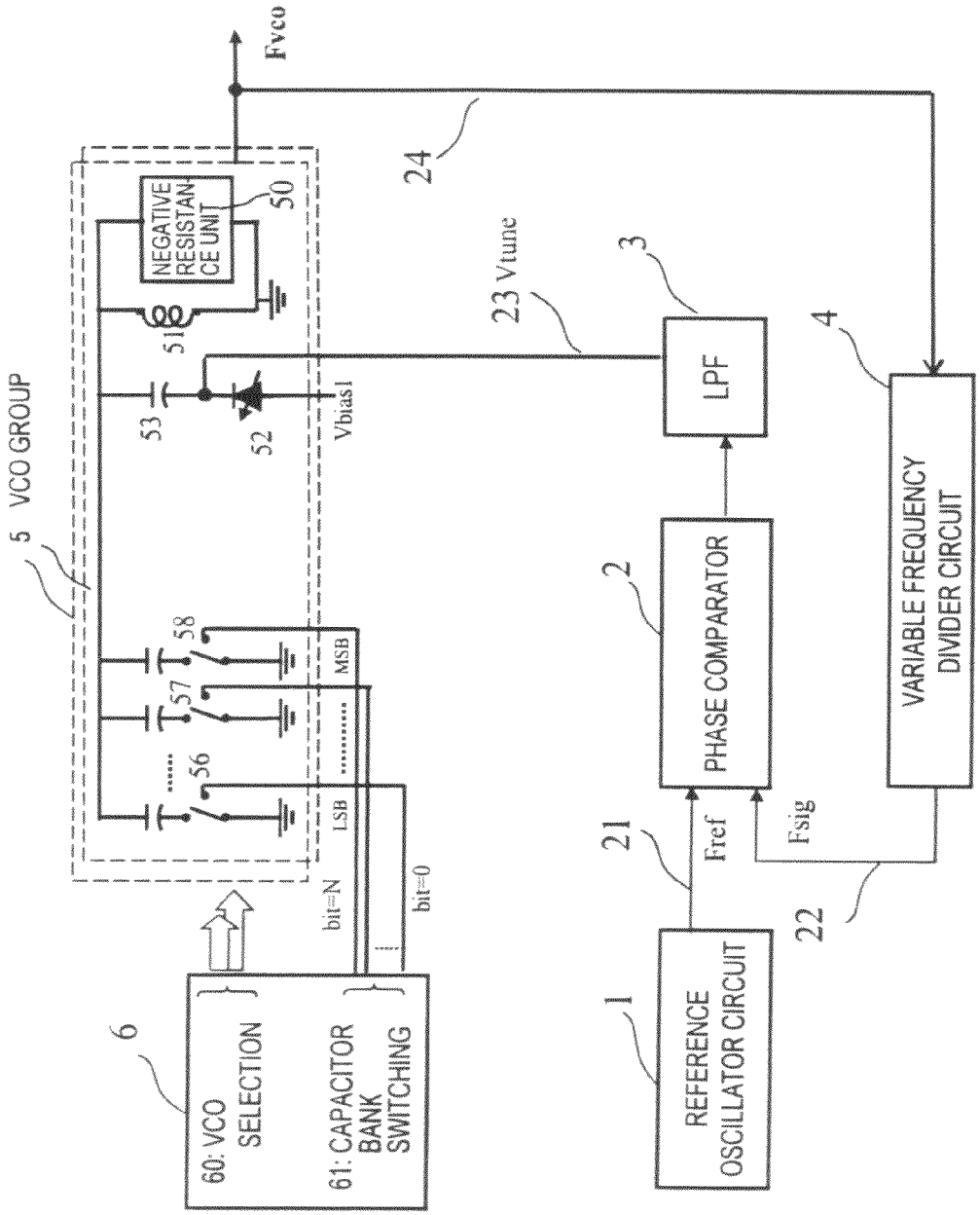
FIG. 1 is a diagram showing a typical configuration of a frequency synthesizer.
Figure 2:
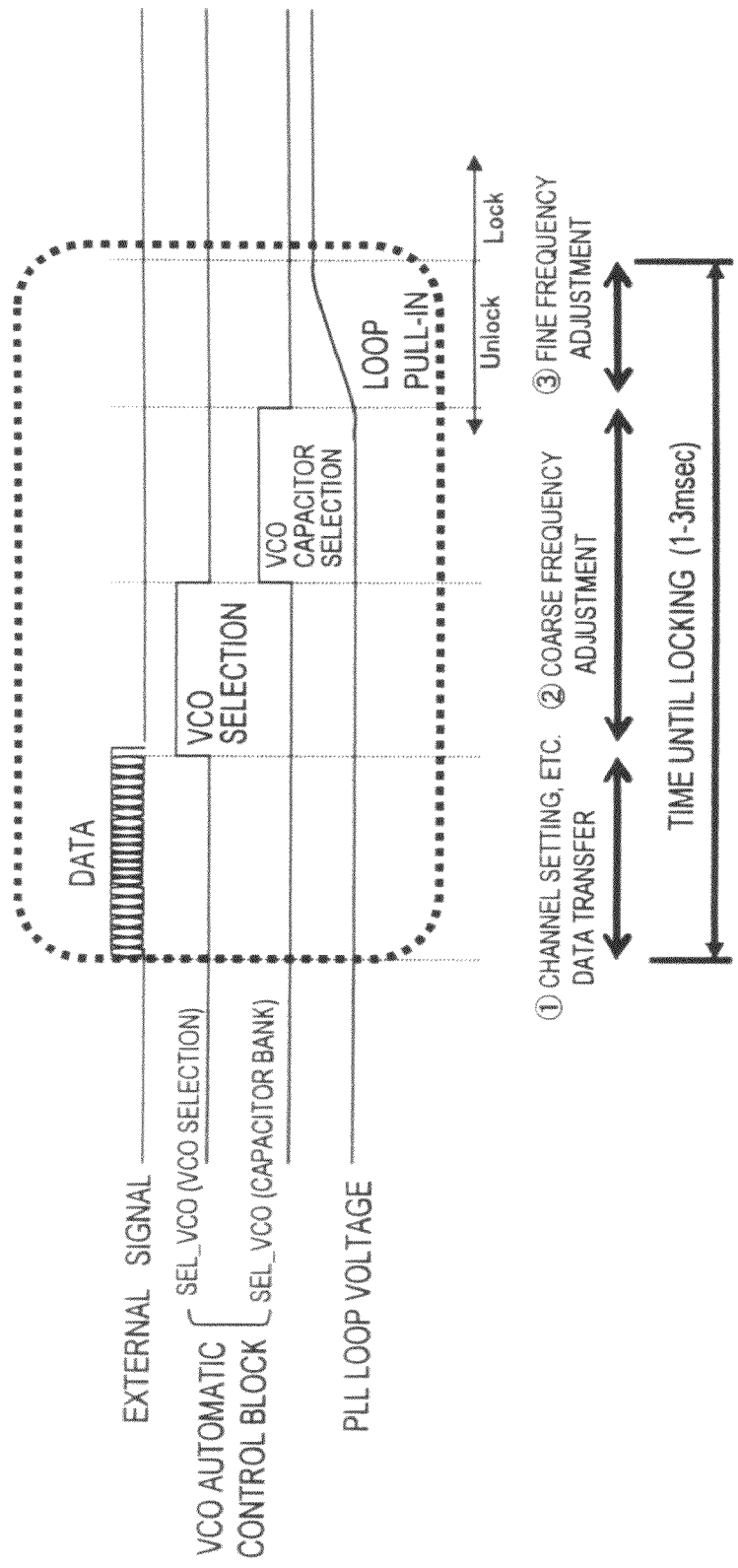
FIG. 2 is a timing diagram for describing operation of FIG. 1.
Figure 3:
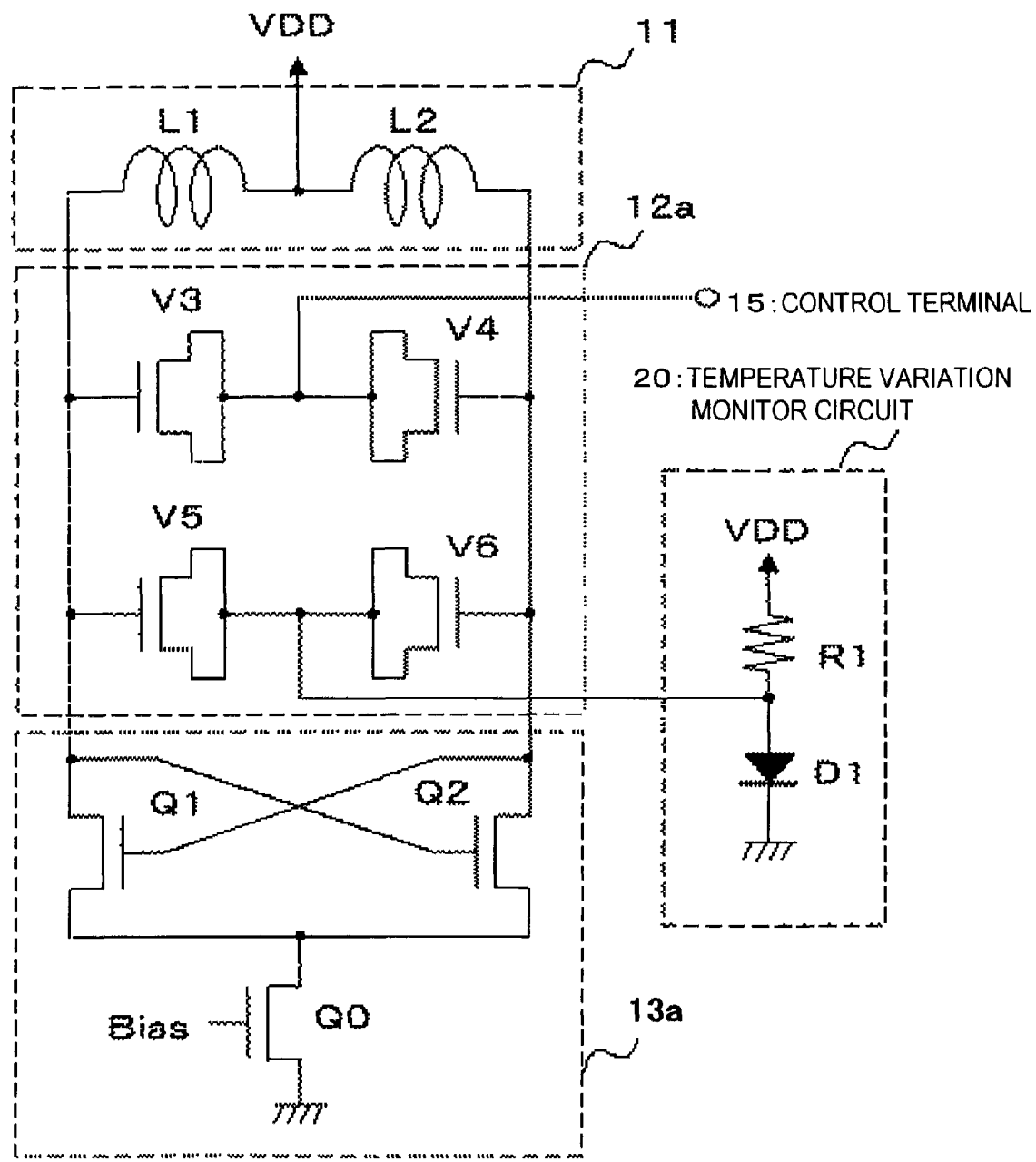
FIG. 3 is a diagram showing a configuration of Patent Document 1.
Figure 4:
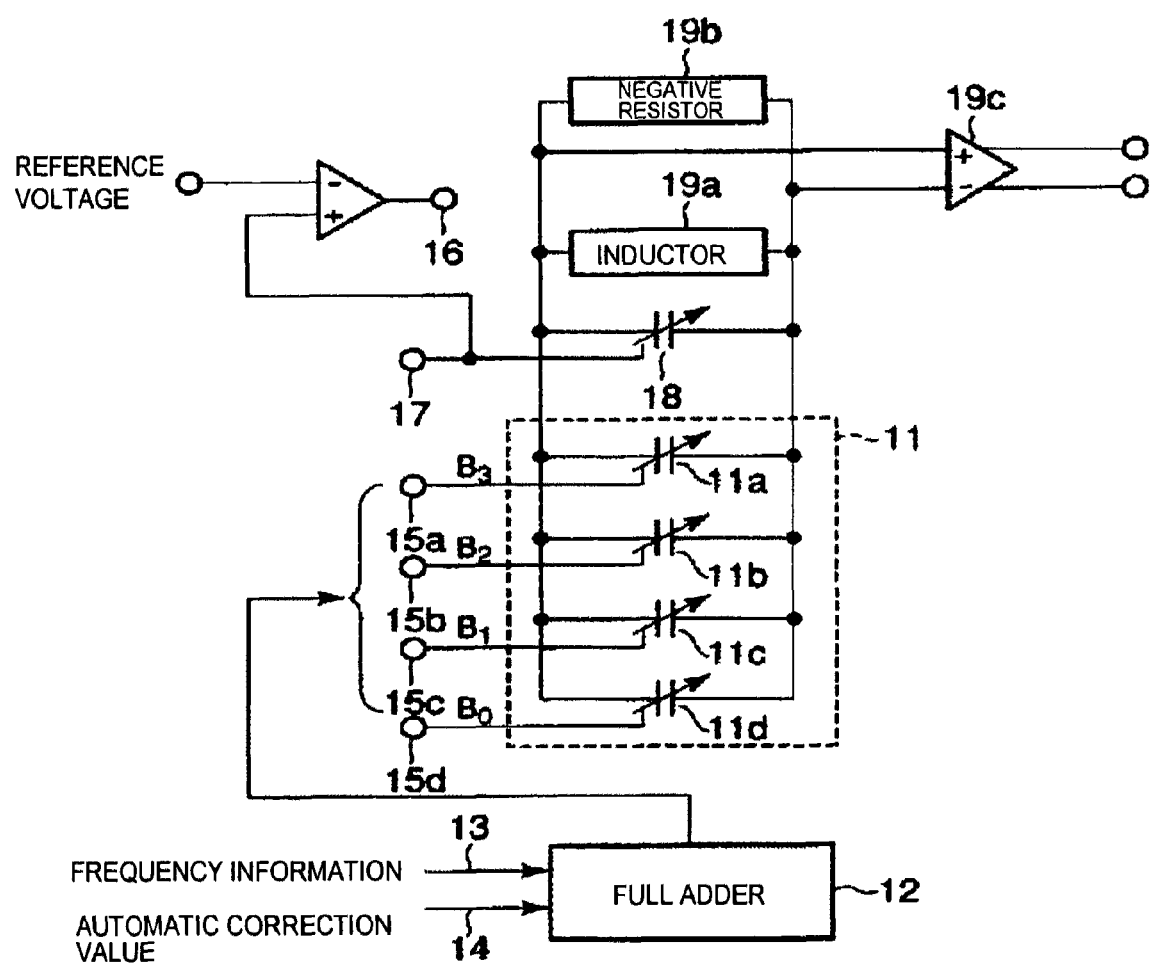
FIG. 4 is a diagram showing a configuration of Patent Document 2.

Normal frequency tuning flow, similar to related technology shown in FIG. 2, is performed in a sequence of VCO selection 60, switching 61 of VCO capacitor bank (coarse frequency adjustment), and phase pull-in by changing the control voltage 23 of the varactor 52 for fine frequency adjustment.

In a lock process as above, the correction potential 25 changes in real-time from an initial value to a combined value of a correction voltage (output of the variable gain amplifier 72) prescribed by capacitor bank control information at this time, and a varactor correction value.

After the PLL is locked, in a case where the ambient temperature varies, the output voltage of the correction potential generation circuit 73 of a varactor capacitor changes so as to compensate for the temperature dependency of the varactor capacitor.

The output voltage of the correction potential generation circuit 71 for the parasitic capacitance of the capacitor bank changes so as to compensate for the temperature dependency of the parasitic capacitance of, among the capacitor elements 56 to 58, a capacitor bank that is in an OFF state.

FIG. 8 is a time chart showing the operation of the correction potential generation circuit 71 for parasitic capacitance of the capacitor bank shown in FIG. 7B. Temp represents the ambient temperature. V−' and V+' are terminal voltages of the capacitors C1 and C2 of FIG. 7B, and are supplied to an inverting input terminal (−) and a no-inverting input terminal (+) of the differential amplifier circuit (OPamp). CK1, CLK2, and CLK3 in FIG. 8, refer to CLK1, CLK2, and CLK3 in FIG. 7B. When ON (High), corresponding switches are ON, and when OFF (Low), corresponding switches are OFF. When CLK2 is ON (High), the capacitors C1 and C2 are discharged, and voltages V−' and V+' are reset to a GND potential. When CLK3 is ON (High), an output voltage of OPamp is supplied to Vout.

During t1 to t2, a state is shown in which the temperature is stable. The capacitors C1 and C2 are charged and discharged simultaneously by control of clocks CLK1 and CLK2.

CLK1 falls, and until CLK2 rises, CLK3 is High, a sampling switch SW5 is ON, and output voltage Vout of the differential amplifier (OPAmp) at this time is stored in the capacitor C3.

During t1 to t2 the temperature is constant, and the output voltage Vout of the correction potential generation circuit 71 for the parasitic capacitance of the capacitor bank is constant.

During t2 to t3 a case is shown where the temperature rises. In this case, the parasitic capacitance of the capacitor bank begins to increase, along with the temperature rise.

Then, by charging while CLK1 is ON (High), the voltage (V−') of the capacitor C1 of a capacitor bank replica becomes lower than the voltage (V+') of the fixed capacitor C2. A rising and falling waveform of the voltage V−' is more blunt than for V+'. Therefore the output voltage Vout of OPamp rises with time.

During t3 to t4, when the temperature again becomes stable, since a difference in time constant of a replica capacitor C1 of the capacitor bank and a fixed capacitor C2 becomes constant, the output voltage Vout of OPamp also becomes constant.

An example of generation of a correction potential according to a specific capacitor bank is described. For example, with a 6 stage capacitor bank VCO, locking is assumed for "011111" (a MSB (Most Significant bit) capacitor is OFF, and the other 5 stage capacitors are ON). The temperature dependency of the VCO frequency at this time is due to the temperature dependency of the varactor and the temperature dependency of the parasitic capacitance of a MOS switch of the highest capacitor bank (MSB).

As shown in Expression (2), according to S5=1, S4=S3=S2=S1=S0=0, $$Re=1/(Go+A_5) \qquad (3)$$

Figure 9:
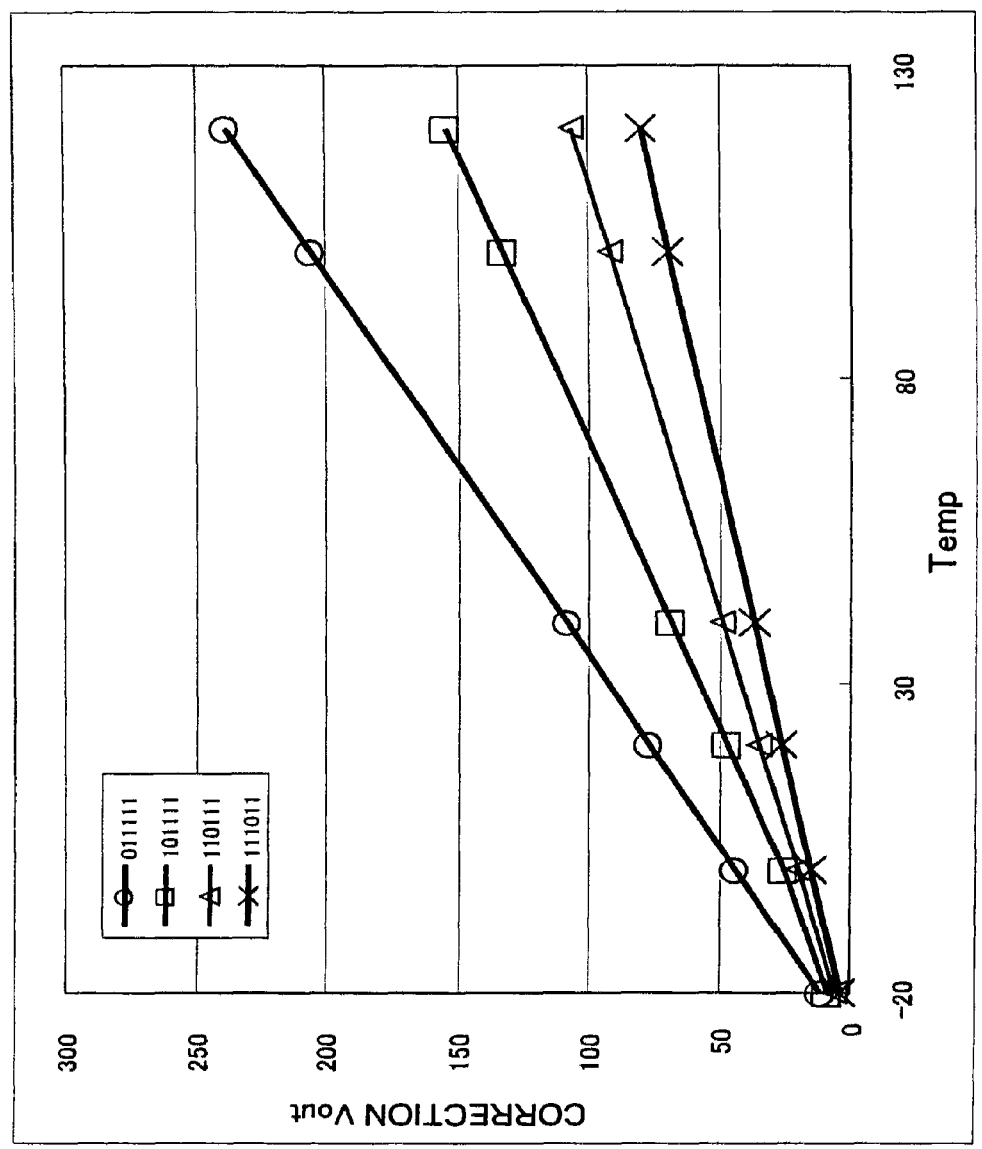
FIG. 9 is a diagram for describing operation of the correction potential generation circuit for parasitic capacitance of the capacitor bank.

FIG. 9 is a diagram schematically showing a correction voltage Vout (output voltage of the variable gain amplifier 7 of FIG. 5) when a capacitor bank control signal (bit=0 ... bit=N) is changed. The slope of each line corresponds to the gain of the variable gain amplifier 7.

Gain of line "011111" is Gain=Rc×(Go+$A_5$),
Gain of line "101111" is Gain=Rc×(Go+$A_4$),
Gain of line "110111" is Gain=Rc×(Go+$A_3$), and
Gain of line "111011" is Gain=Rc×(Go+$A_2$).

Since the size ($2^{n-1}$(W/L)) of a MSB control MOS switch is largest, the parasitic capacitance is largest. Therefore, the weighting amount $A_5$ of the MSB is largest.

As described above, in the present exemplary embodiment, after separately generating each of a component correcting a temperature characteristic due to the varactor, and a component correcting a temperature characteristic due to the capacitor bank, and adding these, since they are supplied to a control terminal in order to cancel the VCO temperature dependency, an effect of temperature correction that does not depend on the capacitor bank can be obtained.

$$freq = \frac{1}{2\pi \times \sqrt{L \times \left\{(C_{var}+C'_v) + \left(\begin{array}{c} C_{bank\_on} + \\ C_{bank\_off} + \\ C_{bit\_Compensation} \end{array}\right)\right\}}} \qquad (4)$$

In this regard,
L is an inductor value,
Cvar is a varactor capacitance value,
Cv' is a compensation capacitance for a varactor capacitance,
Cbank_on is a capacitance value of a part of a capacitor bank that is ON,
Cbank_off is a capacitance value of a part of a capacitor bank that is OFF,
Cbit_compensation is a compensation capacitance of the capacitor bank parasitic capacitance.

Below, a description is given using Expression (4) of a reason that a problem of the abovementioned related technology is solved by the present exemplary embodiment.

Cbank_on (the capacitance value of a part of the capacitor bank that is ON) Cbank_off (the capacitance value of a part of the capacitor bank that is OFF) change according to a value of the capacitor bank control signal (bit=0 ... bit=N). Since most of Cbank_off is occupied by switch MOS parasitic capacitance of the capacitor bank, it has a temperature characteristic.

In the present exemplary embodiment, the temperature compensation block 7 performs control so that the compensation capacitance Cv' of the varactor capacitance corrects the temperature characteristic of the varactor capacitance value Cvar.

In the present exemplary embodiment, the gain of the variable gain amplifier 72 that adjusts the value of Cbit_compensation in accordance with the parasitic capacitance value of the capacitor bank is controlled, and control is performed so that Cbit_compensation (the compensation capacitance of the capacitor bank parasitic capacitance) corrects the temperature of Cbank_off, without depending on a bit value of the capacitor bank control signal (bit=0 ... bit=N).

According to the above description, in comparison to a frequency synthesizer in accordance with the related technology, is large in the present exemplary embodiment. In particular, a problem due to the temperature characteristic of parasitic capacitance of the capacitor bank, which is a problem in Patent Documents 1 and 2 as described above, is resolved.

Second Exemplary Embodiment

Figure 10:
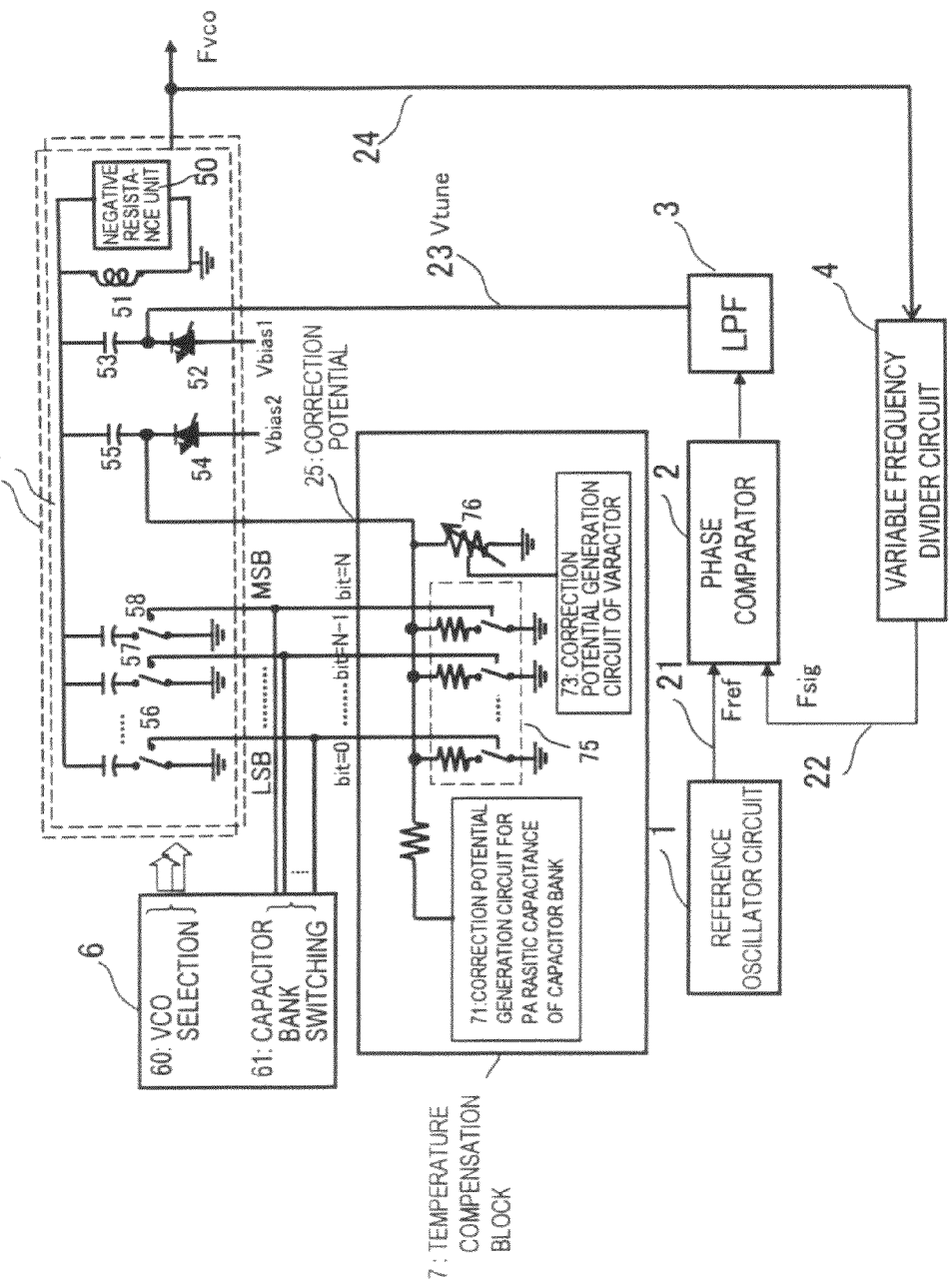
FIG. 10 is a diagram showing a configuration of a second exemplary embodiment of the present invention.

FIG. 10 is a diagram showing a configuration of a second exemplary embodiment of a frequency synthesizer of the present invention. In the present exemplary embodiment, as shown in FIG. 10, with a control signal bit=0, bit=N, of a VCO capacitor bank, ON and OFF states of a switch of a parallel resistor array 75 of a temperature compensation block 7 are controlled at the same time. In this way, a resistance value corresponding to each capacitance bit is given a weighting. A variable resistor 76 that responds to an output voltage of a correction potential generation circuit 73 of a varactor is provided. The variable resistor 76 and the parallel resistor array 75 are combined and a correction potential 25 is adjusted as a voltage dividing resistance value.

Third Exemplary Embodiment

Figure 11:
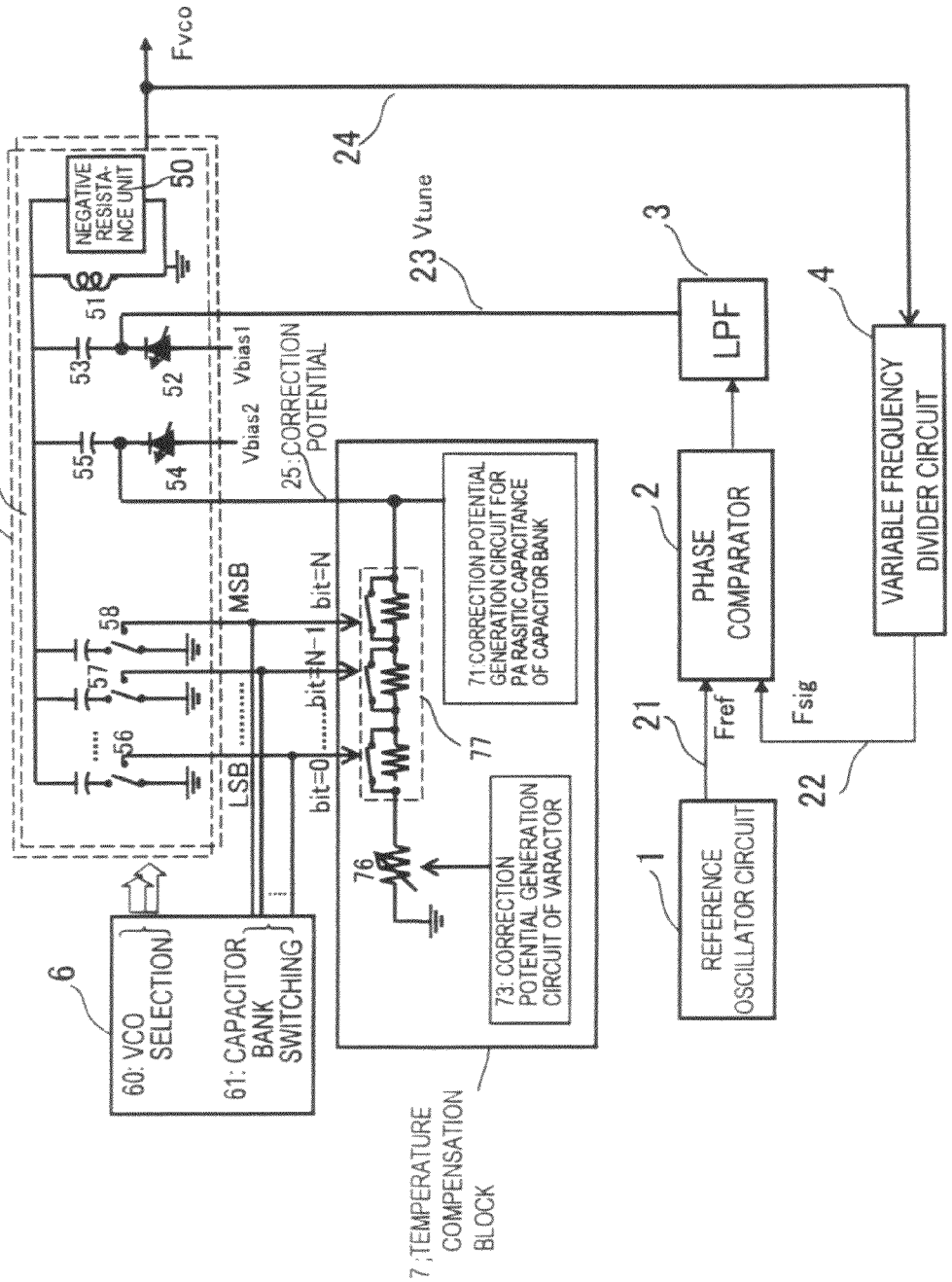
FIG. 11 is a diagram showing a configuration of a third exemplary embodiment of the present invention.

FIG. 11 is a diagram showing a configuration of a third exemplary embodiment of a frequency synthesizer of the present invention. In the present exemplary embodiment, a series resistor array 77 of a temperature compensation block 7 is controlled by a control signal of a VCO capacitor bank. In this way, a resistance value corresponding to each capacitance bit is given a weighting. A variable resistor 76 that responds to an output voltage of a correction potential generation circuit 71 of a varactor is provided. When bit=0 is "1", the series resistor array 77 skips a resistor.

Fourth Exemplary Embodiment

Figure 12:
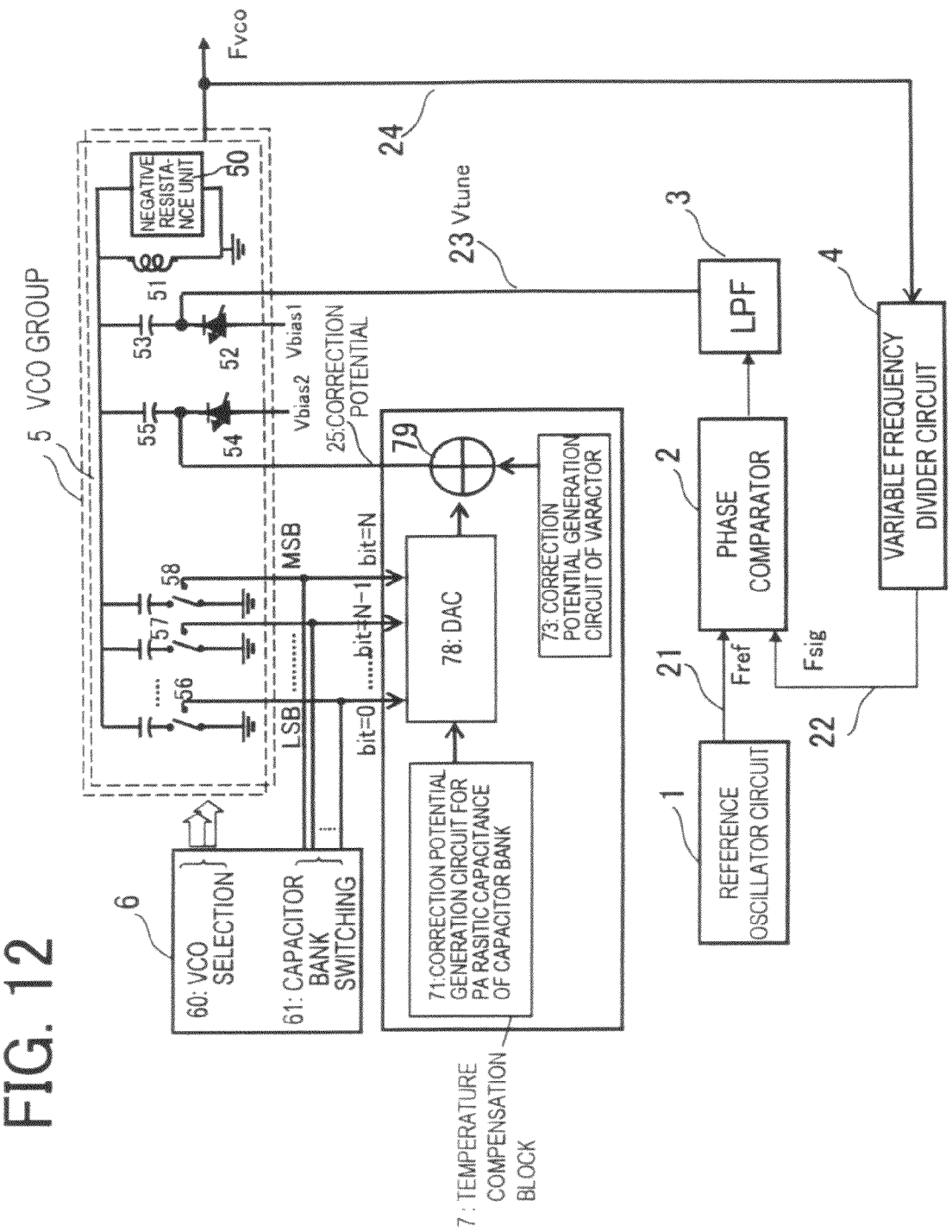
FIG. 12 is a diagram showing a configuration of a fourth exemplary embodiment of the present invention.

FIG. 12 is a diagram showing a configuration of a fourth exemplary embodiment of a frequency synthesizer of the present invention. A correction potential generation circuit 71 for a parasitic capacitance of a capacitor bank doubles as a reference voltage generator of a DAC (digital analog converter) 78. Therefore, a DAC output voltage has a temperature characteristic similar to a reference voltage, and an absolute value thereof is controlled by control information (bit=0, ... bit=N) of a VCO capacitor bank. An output voltage of a correction potential generation circuit 73 of a varactor is added to the output voltage of the DAC 78 by an adder circuit 79, to obtain a correction potential 25.

Fifth Exemplary Embodiment

Figure 13:
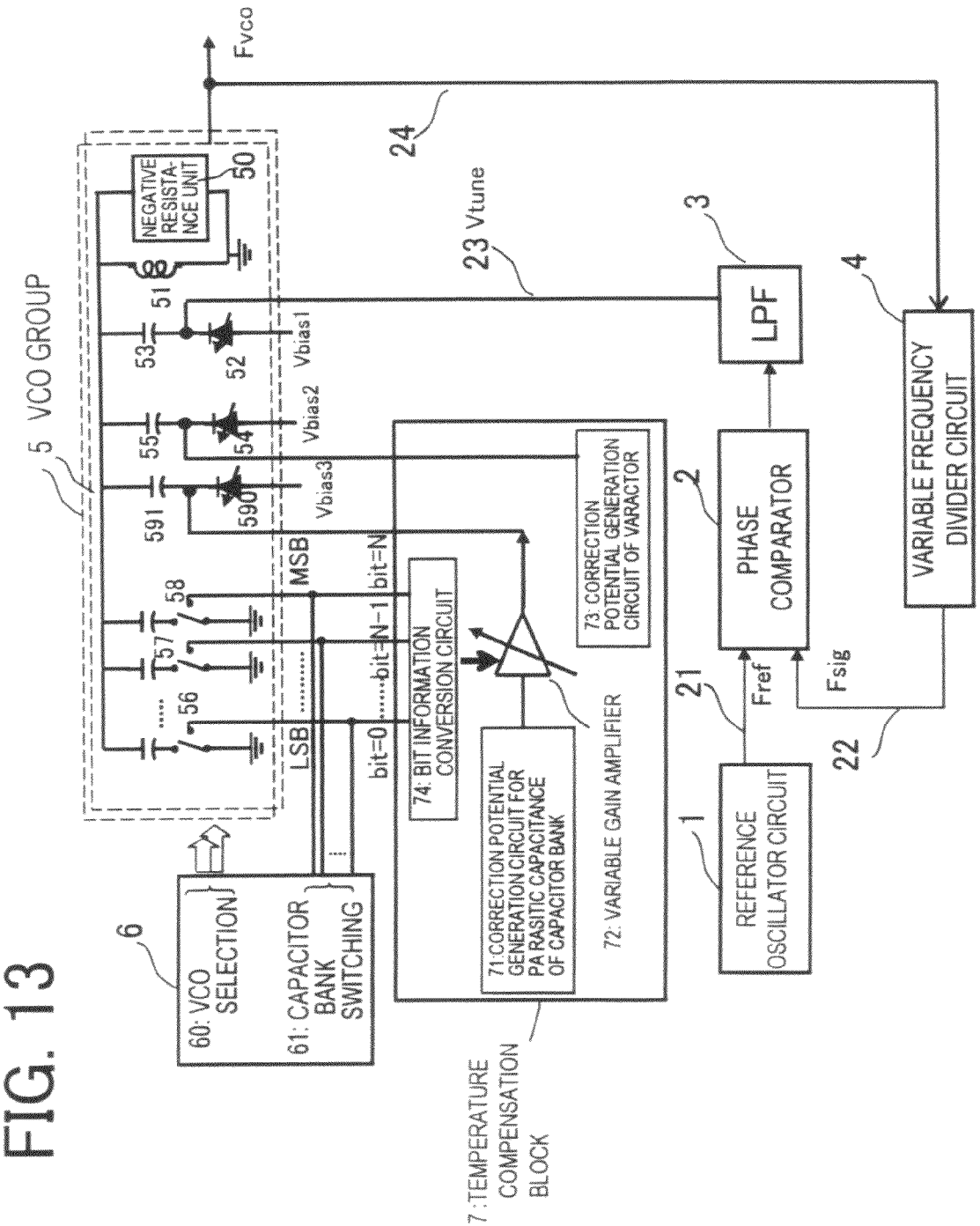
FIG. 13 is a diagram showing a configuration of a fifth exemplary embodiment of the present invention.

FIG. 13 is a diagram showing a configuration of a fifth exemplary embodiment of a frequency synthesizer of the present invention. A correction potential (output potential of a variable gain amplifier 72) that changes in accordance with control information data of a VCO capacitor bank and a correction potential of a correction potential generation circuit 73 of a varactor are respectively applied to 2 independent varactors, a correction varactor 590 and varactor 54, in an oscillation circuit. Anodes of the varactor 590 and the varactor 54 are respectively connected to bias voltages Vbias3 and Vbias2, and cathodes are respectively connected to output of the variable gain amplifier 72 and to output of the correction potential generation circuit 73 of the varactor, and also to a connection point of an inductor 51 and a negative resistance unit 50 via capacitors 591 and 55.

Sixth Exemplary Embodiment

Figure 14:
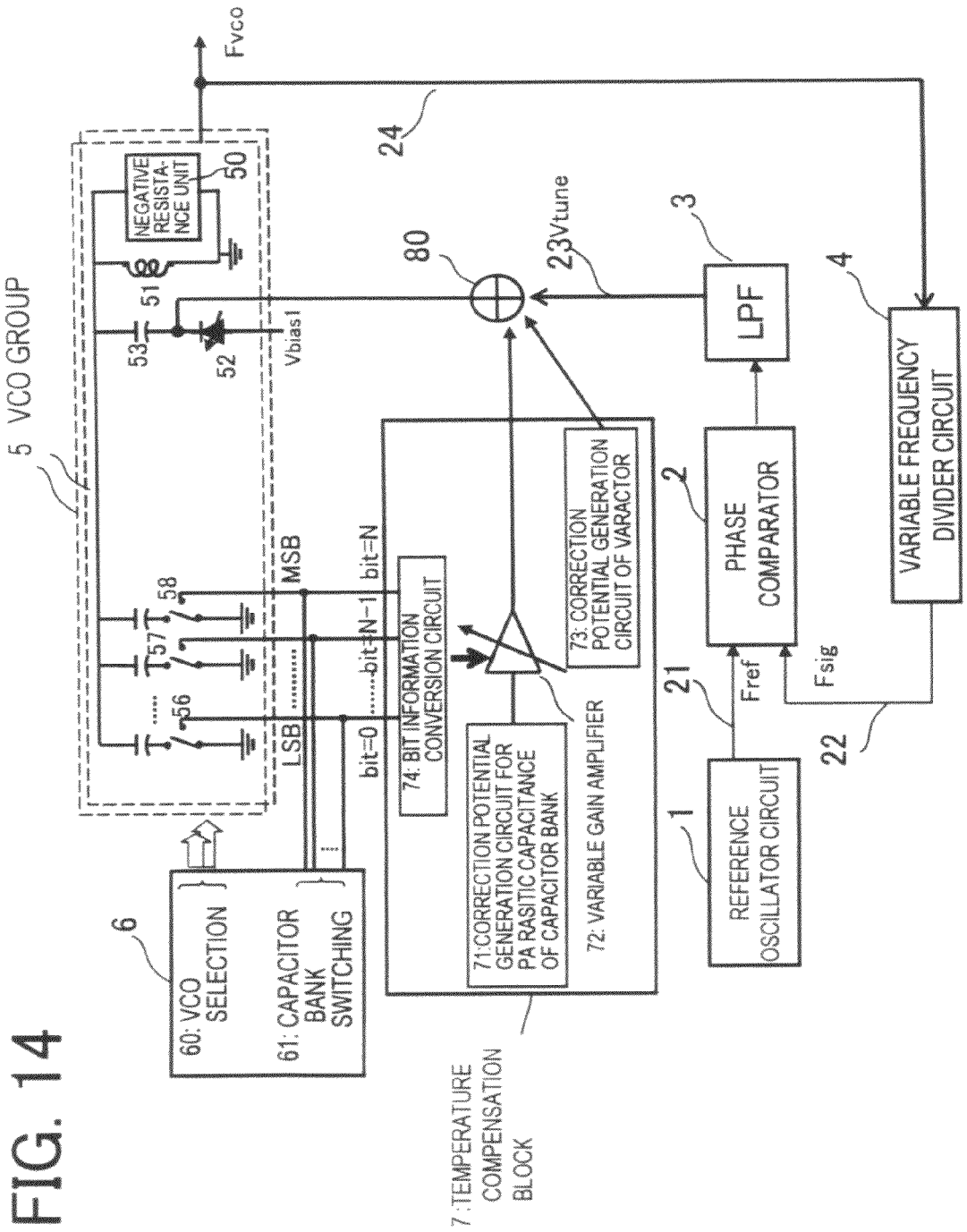
FIG. 14 is a diagram showing a configuration of a sixth exemplary embodiment of the present invention.

FIG. 14 is a diagram showing a configuration of a sixth exemplary embodiment of a frequency synthesizer of the present invention. There is provided an adder circuit 80 that adds a correction potential (output potential of a variable gain amplifier 72) that changes in accordance with control information data of a VCO capacitor bank, a correction potential of a correction potential generation circuit 73 of a varactor, and a PLL loop tuning voltage 23. The adder circuit 80 outputs a voltage that is applied to one varactor 52.

Seventh Exemplary Embodiment

In a seventh exemplary embodiment of the present invention, an overall configuration of a PLL is the same as in FIG. 5. In the present exemplary embodiment, a correction potential generation circuit 71 for a parasitic capacitance of a capacitor bank is used as a constant voltage source designed so that a temperature dependency of an output voltage has a certain desired value. In this case, in comparison to a method of estimating parasitic capacitance using a replica circuit of the capacitor bank, there is a tendency for a temperature dependency correction error, due to device variation and the like, to become large. However, if the temperature dependency correction error is such that required accuracy is satisfied, even with this type of configuration, there is no particular problem in practice.

Figure 15:
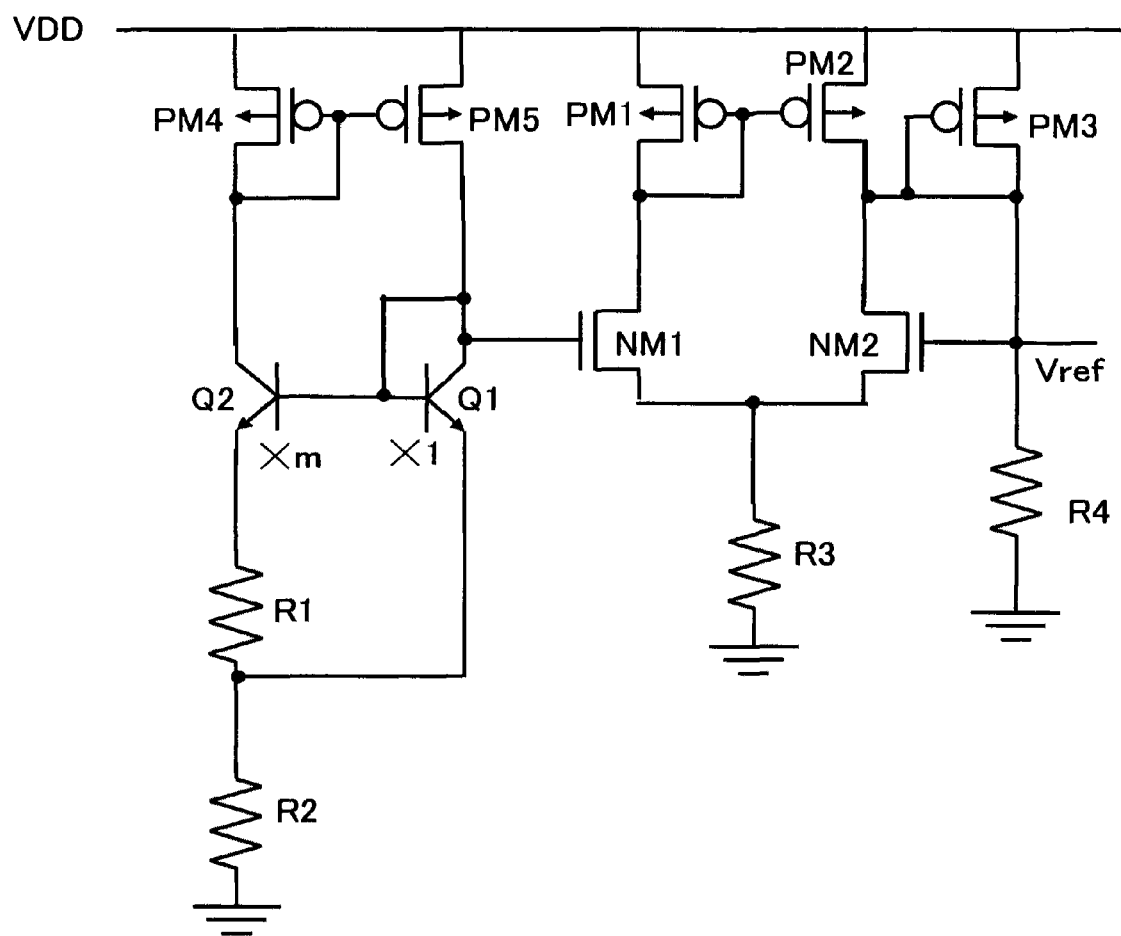
FIG. 15 is a diagram showing a configuration of a constant voltage source according to a seventh exemplary embodiment of the present invention.

FIG. 15 shows one example of this type of constant voltage source. A differential pair of NMOS transistors NM1 and NM2 and a current mirror of PMOS transistors PM1 and PM2 forming a load of a differential pair, form a differential stage; a PMOS transistor PM3 receives output of the differential stage and is a driver (output transistor) that drives an output terminal; output terminal Vref has a feedback connection to input (a gate of the NMOS transistor NM2) of the differential stage; and a non-inverting negative feedback amplifier circuit (voltage follower) with gain=1 is formed. That is, a voltage applied to a gate of the NMOS transistor NM1 is outputted to Vref.

With regard to transistors Q1 and Q2 having an emitter area ratio of 1:m, respective collector currents of $I_{c\,1}$ and $I_{c\,2}$, base-emitter voltages of $V_{B\,E\,1}$ and $V_{B\,E\,2}$, $I_S$ as a reverse collector saturation current, and $V_T$ (=kT/q, k: Boltzmann constant, T: absolute temperature, q: electron unit charge), then Expressions (5) and (6) hold. Current driving capability (W/L, W is gate (channel) width, L is gate (channel) length) of the PMOS transistors PM4 and PM5 forming the current mirror is m:1.

$$I_{C1} = Is \times \exp\left(\frac{V_{BE1}}{V_T}\right) \qquad (5)$$

$$I_{C2} = m \times Is \times \exp\left(\frac{V_{BE2}}{V_T}\right) \qquad (6)$$

From Expressions (5) and (6), the following Expression (7) holds.

$$\frac{I_{C1}}{I_{C2}} = \left(\frac{1}{m}\right) \times \exp\left(\frac{V_{BE1} - V_{Be2}}{V_T}\right) \qquad (7)$$

Taking the logarithm (ln) of both sides of Expression (7) and arranging, Expression (8) is obtained.

$$V_{BE1} - V_{BE2} = V_T \times \ln\left(\frac{m \times I_{C1}}{I_{C2}}\right) \qquad (8)$$

Regarding an emitter current IE2 of transistor Q2 as being equal to the collector current IC2, $$R_1 \times I_{C2} = V_{BE1} - V_{BE2} \qquad (9)$$

Therefore, we have $$I_{C2} = \left(\frac{V_T}{R_1}\right) \times \ln\left(\frac{m \times I_{C1}}{I_{C2}}\right) \quad (10)$$

The gate voltage of the NMOS transistor NM1 is given by $$V_{BE1} + R_2 \times (I_{C1} + I_{C2}) = V_{BE1} + \left(\frac{R_2}{R_1}\right) \times V_T \times \ln\left(\frac{m \times I_{C1}}{I_{C2}}\right) + R_2 \times I_{C1} \quad (11)$$

A base-emitter voltage $V_{BE}$ has a temperature coefficient of $-2$ mV/° C., and a heat temperature $V_T$ has a temperature coefficient of $+0.085$ mV/° C. The voltage of Expression (11) is outputted as Vref.

A similar effect can be obtained even with a constant voltage source of a form other than this.

Instead of the constant voltage source, it is also possible to have a configuration combining a constant current source that outputs a current having a temperature dependency such as PTAT (Proportional To Absolute Temperature) and a current-voltage conversion circuit. A combination is also possible of a constant current source that does not have a temperature dependency and a current-voltage conversion circuit in which a temperature dependency is designed. According to the present invention as described above, since a sum of a variable capacitance range of a varactor for fine frequency adjustment and a variable capacitance range of a compensation varactor controlled by a temperature compensation block output contributes to tolerance with regard to temperature variation, locking of the PLL is not easily released.

The various disclosures of the abovementioned Patent Documents and Non-Patent Document are incorporated herein by reference thereto. Modifications and adjustments of embodiments and examples are possible within bounds of the entire disclosure (including the scope of the claims) of the present invention, and also based on fundamental technological concepts thereof. A wide variety of combinations and selections of various disclosed elements are possible within the scope of the claims of the present invention. That is, the present invention clearly includes every type of transformation and modification that a person skilled in the art can realize according to technological concepts and the entire disclosure including the scope of the claims.

What is claimed is:

1. A frequency synthesizer apparatus comprising:
a voltage controlled oscillator circuit that varies an oscillation frequency thereof by a control voltage supplied thereto, the voltage controlled oscillator circuit including:
   a variable capacitance element; and
   a capacitor bank that includes a plurality of weighted capacitance elements and a plurality of switches controlled as being turned ON and OFF based on a plurality of control bit signals corresponding to the plurality of weighted capacitance elements, respectively;
a phase comparator that performs a phase comparison between an output signal fed back from the voltage controlled oscillator circuit and a reference signal supplied thereto, the output signal from the voltage controlled oscillator circuit being fed back directly or via a frequency divider to an input of the phase comparator;
a loop filter that generates a control voltage for supply to the voltage controlled oscillator circuit, based on a result of the phase comparison;
a temperature compensation block that includes:
   a first correction potential generation circuit that generates a correction potential for parasitic capacitance of the capacitor bank of the voltage controlled oscillator circuit;
   a second correction potential generation circuit that generates a correction potential for the variable capacitance element; and
   a weighting circuit that performs weighting processing, based on the control bit signals; and
a combining circuit that combines effects of said first and second correction potential generation circuits and said weighting circuit.

2. The frequency synthesizer apparatus according to claim 1, wherein the temperature compensation block further comprises a circuit that generates a voltage corresponding to the control bit signals, and the weighting circuit comprises a variable gain amplifier that have a gain varied by the voltage generated corresponding to the control bit signals.

3. The frequency synthesizer apparatus according to claim 1, wherein the first correction potential generation circuit comprises:
a replica circuit of the capacitor bank;
an other fixed capacitor, the replica circuit having a capacitor being charged for a prescribed time with a prescribed current, while the other fixed capacitor being charged for the same prescribed time with the same prescribed current; and
a differential amplifier circuit that detects and outputs a voltage difference between terminal voltages of the capacitor of the replica circuit and the other fixed capacitor.

4. The frequency synthesizer apparatus according to claim 1, wherein the weighting circuit comprises a parallel resistor array including a plurality of resistor-sets, connected in parallel, each resistor-set having a resistor and a switch connected in series to the resistor, the switch being turned ON and OFF by the control bit signal, and
wherein the combining circuit comprises a variable resistor with a resistance thereof varied by an output of the second correction potential generation circuit, the variable resistor being connected in parallel to the parallel resistor array, and connected to the variable capacitance element.

5. The frequency synthesizer apparatus according to claim 1,
wherein, in the temperature compensation block, the weighting circuit comprises a resistor array including a plurality of resistor-sets connected in series, each resistor-set having a resistor and a switch connected in parallel to the resistor, the switch being turned ON and OFF by a respective one of plurality of control bit signals and shorting the resistor when ON, and
wherein the combining circuit comprises a variable resistor having a resistance thereof varied by an output of the second correction potential generation circuit, the resistor array being connected in series to the variable resistor and being connected to the variable capacitance element.

6. The frequency synthesizer apparatus according to claim 1, wherein the weighting circuit comprises a digital-to-analog conversion circuit that receives an output voltage of the first correction potential generation circuit as a reference voltage, and outputs a voltage according to the control bit signals.

7. The frequency synthesizer apparatus according to claim 1, wherein the voltage control oscillation circuit further comprises:

another variable capacitance element that receives an output voltage of the weighting circuit, and wherein the variable capacitance element receives an output voltage of the second correction potential generation circuit.

8. The frequency synthesizer apparatus according to claim 1, further comprising a circuit that combines an output voltage of the weighting circuit in the temperature compensation block, an output voltage of the second correction potential generation circuit, and an output of the loop filter, the combined voltage being applied to the variable capacitance element of the voltage control oscillation circuit.

9. The frequency synthesizer apparatus according to claim 1, wherein the first correction potential generation circuit comprises a voltage source designed so that a temperature dependency of an output voltage of the first correction potential generation circuit has a certain desired value.

10. The frequency synthesizer apparatus according to claim 1, wherein the variable capacitance element of the voltage controlled oscillator has a capacitance that is controlled by an output of the combining circuit of the temperature compensation block.

11. The frequency synthesizer apparatus according to claim 1, wherein the combining circuit combines an output voltage of the second correction potential generation circuit and an output voltage of the weighting circuit.

12. The frequency synthesizer apparatus according to claim 1, wherein the weighting circuit comprises a parallel resistor array including a plurality of resistor-sets.

13. A frequency synthesizer apparatus comprising:
a voltage controlled oscillator circuit that varies an oscillation frequency thereof by a control voltage supplied thereto, the voltage controlled oscillator circuit including:
a variable capacitance element; and
a capacitor bank that includes a plurality of weighted capacitance elements and a plurality of switches controlled as being turned ON and OFF based on a plurality of control bit signals corresponding to the plurality of weighted capacitance elements, respectively;
a phase comparator that performs a phase comparison between an output signal fed back from the voltage controlled oscillator circuit and a reference signal supplied thereto, the output signal from the voltage controlled oscillator circuit being fed back directly or via a frequency divider to an input of the phase comparator;
a loop filter that generates a control voltage for supply to the voltage controlled oscillator circuit, based on a result of the phase comparison; and
a temperature compensation block that includes a first correction potential generation circuit that generates a correction potential for parasitic capacitance of the capacitor bank of the voltage controlled oscillator circuit.

14. The frequency synthesizer apparatus according to claim 13, wherein the temperature compensation block further comprises a second correction potential generation circuit that generates a correction potential for the variable capacitance element.

15. The frequency synthesizer apparatus according to claim 14, wherein a capacitance of the variable capacitance element of the voltage controlled oscillator circuit varies depending on an output of the first correction potential generation circuit and an output of the second correction potential generation circuit.

16. The frequency synthesizer apparatus according to claim 15, wherein the variable capacitance element comprises:
a first variable capacitance element that receives the output of the first correction potential generation circuit; and
a second variable capacitance element that receives the output of the second correction potential generation circuit.

17. The frequency synthesizer apparatus according to claim 13, wherein the temperature compensation block further comprises a weighting circuit that performs weighting processing, based on the control bit signals.

18. The frequency synthesizer apparatus according to claim 17, wherein the temperature compensation block further comprises a second correction potential generation circuit that generates a correction potential, wherein the frequency synthesizer apparatus further comprises a combining circuit that combines the correction potential of the second correction potential generation circuit and an output voltage of the weighting circuit, and
wherein the capacitance of the variable capacitance element of the voltage controlled oscillator is controlled by an output of the combining circuit.

19. The frequency synthesizer apparatus according to claim 13, wherein the variable capacitance element comprises a first variable capacitance element and a second variable capacitance element, and
wherein, when an ambient temperature of the frequency synthesizer apparatus is substantially stable, the first and second variable capacitances are charged and discharged at substantially a same time.

20. The frequency synthesizer apparatus according to claim 13, wherein the temperature compensation block generates a second correction potential, and
wherein the variable capacitance element comprises:
a first variable capacitance element that receives the correction potential; and
a second variable capacitance element that receives the second correction potential.

* * * * *